(12) United States Patent
Hsu et al.

(10) Patent No.: US 12,300,556 B2
(45) Date of Patent: May 13, 2025

(54) ELECTRONIC DEVICE AND METHOD FOR MANUFACTURING THE SAME

(71) Applicant: Innolux Corporation, Miao-Li County (TW)

(72) Inventors: Chih-Yuan Hsu, Miao-Li County (TW); Kuang-Ming Fan, Miao-Li County (TW); Wen-Hsiang Liao, Miao-Li County (TW)

(73) Assignee: Innolux Corporation, Miaoli (TW)

( * ) Notice: Subject to any disclaimer, the term of this patent is extended or adjusted under 35 U.S.C. 154(b) by 592 days.

(21) Appl. No.: 17/510,403

(22) Filed: Oct. 26, 2021

(65) Prior Publication Data

US 2023/0050743 A1 Feb. 16, 2023

(30) Foreign Application Priority Data

Aug. 10, 2021 (CN) .......................... 202110911801.3

(51) Int. Cl.
*G03F 7/20* (2006.01)
*H01L 21/66* (2006.01)

(52) U.S. Cl.
CPC .............. *H01L 22/32* (2013.01); *H01L 22/12* (2013.01)

(58) Field of Classification Search
CPC ......... H01L 22/32; H01L 22/12; H01L 22/20; H01L 22/30; G03F 7/70633; G03F 7/70683
See application file for complete search history.

(56) References Cited

U.S. PATENT DOCUMENTS

| 10,877,464 B2 | 12/2020 | Chao et al. |
| 2005/0008217 A1* | 1/2005 | Luu .......................... G06T 7/001 382/145 |
| 2020/0058121 A1* | 2/2020 | Mori ................. H01L 21/67109 |

FOREIGN PATENT DOCUMENTS

| CN | 110031968 | 7/2019 |
| TW | I484136 | 5/2015 |
| TW | I484139 | 5/2015 |

OTHER PUBLICATIONS

"Office Action of Taiwan Counterpart Application", issued on Sep. 30, 2022, p. 1-p. 8.

\* cited by examiner

*Primary Examiner* — Mesfin T Asfaw
(74) *Attorney, Agent, or Firm* — JCIPRNET (57) ABSTRACT

A method for manufacturing an electronic device is provided, the method includes: providing an inspection module to inspect a first area of the electronic device to obtain a first information and inspect a second area of the electronic device to obtain a second information; transmitting the first information and the second information to a processing system; comparing the first information and the second information to obtain a difference; and transmitting a correction information to a first process machine via a first interface system. When the difference is greater than or equal to -2 and less than or equal to 2, the first process machine is started to produce. An electronic device is also provided.

18 Claims, 9 Drawing Sheets

ELECTRONIC DEVICE AND METHOD FOR MANUFACTURING THE SAME

CROSS-REFERENCE TO RELATED APPLICATION

This application claims the priority benefit of China application serial no. 202110911801.3, filed on Aug. 10, 2021. The entirety of the above-mentioned patent application is hereby incorporated by reference herein and made a part of this specification.

BACKGROUND OF THE DISCLOSURE

Field of the Disclosure

The disclosure relates to a manufacturing method of an electronic device, in particular to a manufacturing method for improving the reliability of an electronic device.

Description of Related Art

In recent years, electronic devices are becoming smaller and more elements need to be integrated into the electronic devices, and the design and quality of metal traces between the elements affect the reliability of the electronic devices. For example, in the fan-out panel-level package technique of electronic devices, a metal circuit layer is repeatedly stacked on the substrate, then packaging is performed. During the manufacturing process, the stacking of a plurality of metal circuits may increase the warpage degree of the substrate or affect the alignment accuracy of the subsequent manufacturing process, thereby reducing the process yield or affecting the reliability of the electronic device. Therefore, providing a manufacturing method for improving the reliability of electronic devices is a subject that needs urgent attention.

SUMMARY OF THE DISCLOSURE

The disclosure provides a method for manufacturing an electronic device that is a manufacturing method that may improve the reliability of an electronic device.

According to an embodiment of the disclosure, a method for manufacturing an electronic device includes: providing an inspection module to inspect a first area of the electronic device to obtain a first information and inspect a second area of the electronic device to obtain a second information; transmitting the first information and the second information to a processing system; comparing the first information and the second information to obtain a difference; and transmitting a correction information to a first process machine via a first interface system. When the difference is greater than or equal to −2 and less than or equal to 2, the first process machine is started to produce.

In order to make the above features and advantages of the disclosure better understood, embodiments are specifically provided below with reference to figures for detailed description as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The disclosure may be understood by referring to the following detailed description in conjunction with the accompanying figures. It should be noted that, in order to facilitate the reader's understanding and the conciseness of the figures, the multiple figures in the disclosure depict a portion of the electronic device/display device, and specific elements in the figures are not drawn according to actual scale. In addition, the number and size of each element in the figures are for illustration, and are not intended to limit the scope of the disclosure. For example, for clarity, the relative size, thickness, and location of each film, region, or structure may be reduced or enlarged.

Certain terms are used throughout the specification and the appended claims of the disclosure to refer to particular elements. Those skilled in the art should understand that electronic equipment manufacturers may refer to the same elements under different names. This specification is not intended to distinguish between elements having the same function but different names. In the following description and claims, the words "having" and "including" and the like are open words, so they should be interpreted as meaning "including but not limited to . . . "

The terminology mentioned in the specification, such as: "up", "down", "front", "rear", "left", "right", etc., are directions referring to the drawings. Therefore, the directional terms used are for illustration, not for limiting the disclosure. It should be understood that when an element or film layer is referred to as disposed "on" or "connected" to another element or film layer, the element or film layer may be directly on the other element or film layer or directly connected to the other element or film layer, or there is an inserted element or film layer between the two (indirect case). Conversely, when an element or film layer is referred to as "directly" on or "directly connected" to another element or film layer, there is no intervening element or film layer between the two.

The term "about", "equal", "same", "equivalent", "substantially", or "essentially" mentioned in the specification usually means falling within 10% of a given value or range, or means falling within 5%, 3%, 2%, 1%, or 0.5% of a given value or range. In addition, the phrases "the given range is from a first numerical value to a second numerical value" and "the given range falls within the range of a first numerical value to a second numerical value" mean that the given range contains the first numerical value, the second numerical value, and other values in between.

In some embodiments of the disclosure, terms such as "connection", "interconnection", etc. regarding bonding and connection, unless specifically defined, may mean that two structures are in direct contact, or that two structures are not in direct contact and there are other structures located between these two structures. The terms of bonding and connection may also include the case where both structures are movable or both structures are fixed. In addition, the terms "electrically connected" and "coupled" include any direct and indirect electrical connection means. In addition, terms such as "first" and "second" mentioned in the specification or claims are used to name different elements or to distinguish different embodiments or ranges, and are not used to limit the upper limit or the lower limit of the number of elements and are also not used to limit the manufacturing order or arrangement order of the elements.

Figure 1A:
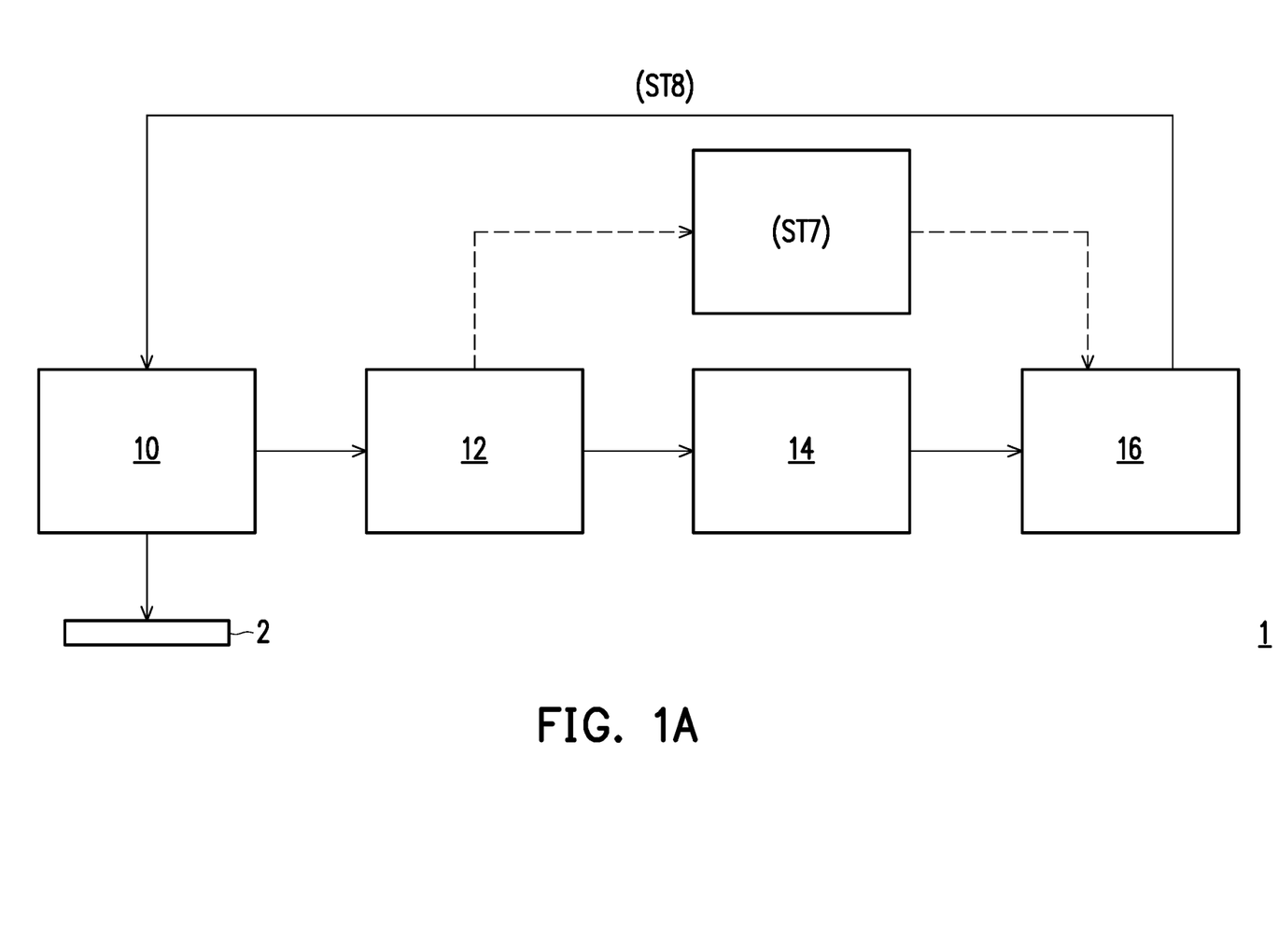
FIG. 1A and FIG. 1B are respectively schematic flowcharts of a method for manufacturing an electronic device according to some embodiments of the disclosure.
Figure 1B:
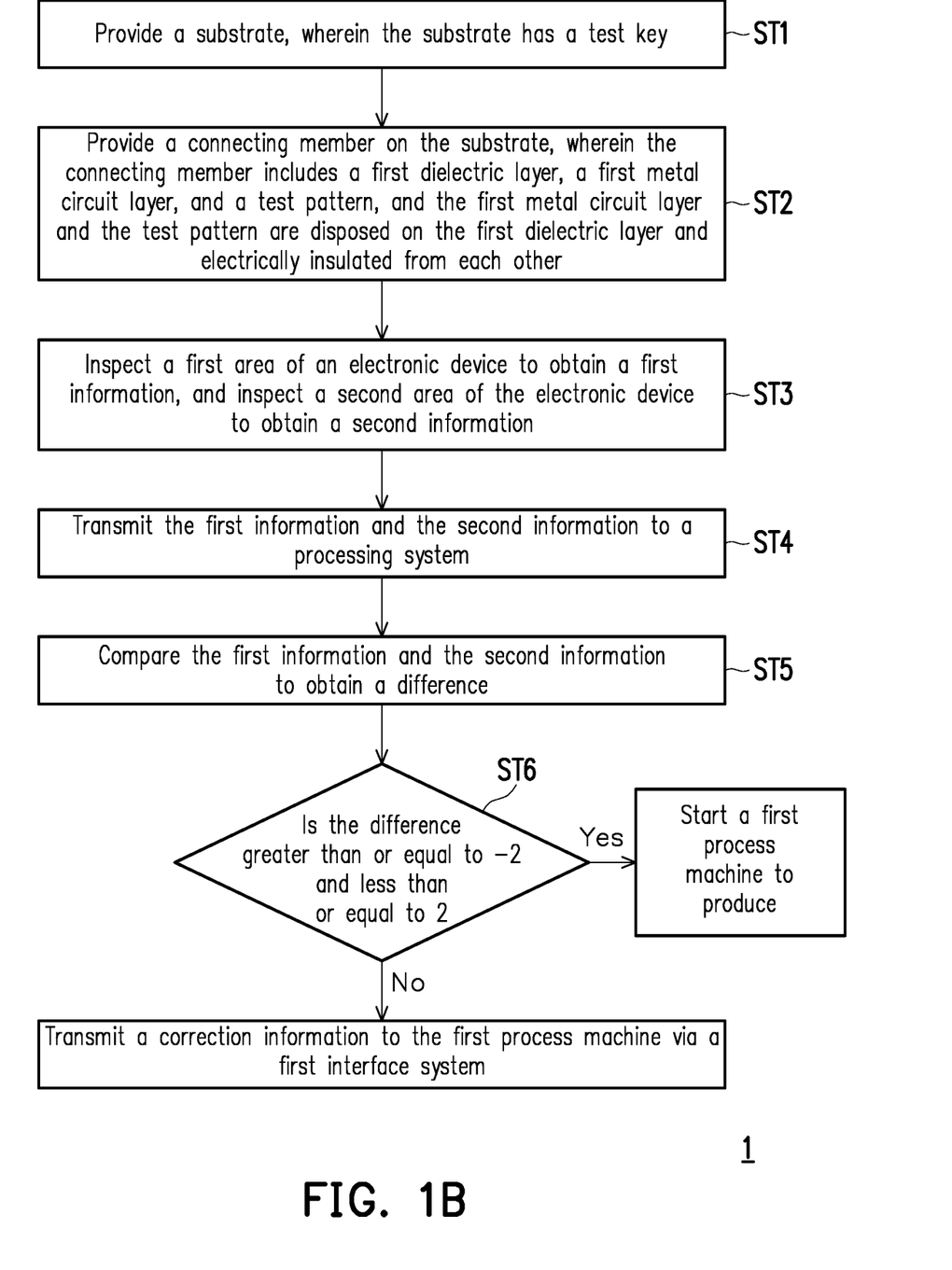
Figure 2:
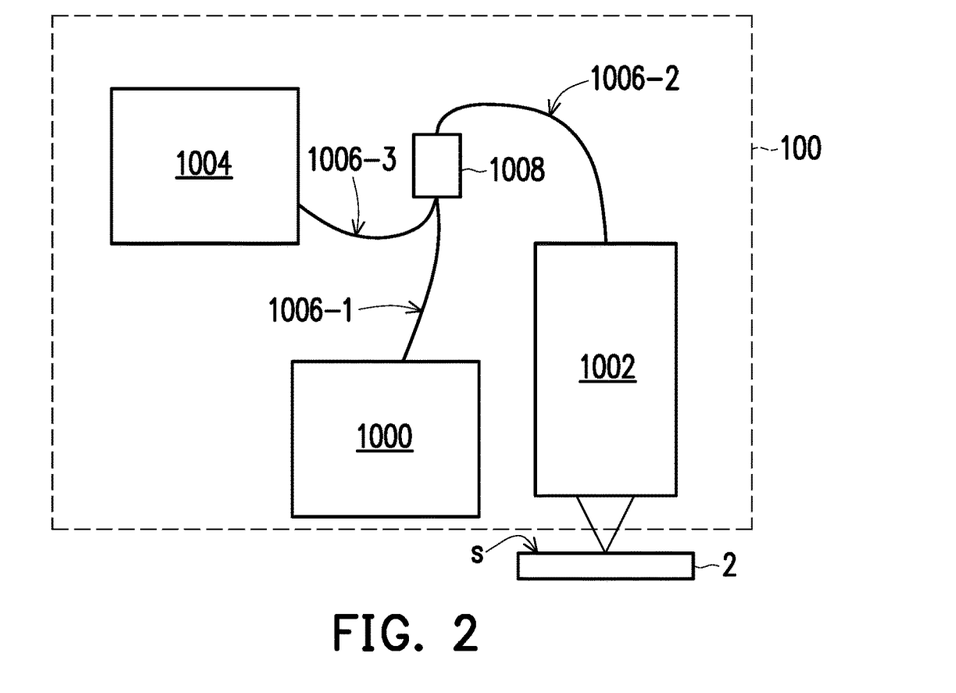
FIG. 2 is a schematic diagram of a color confocal module of the inspection module in FIG. 1A.
Figure 3:
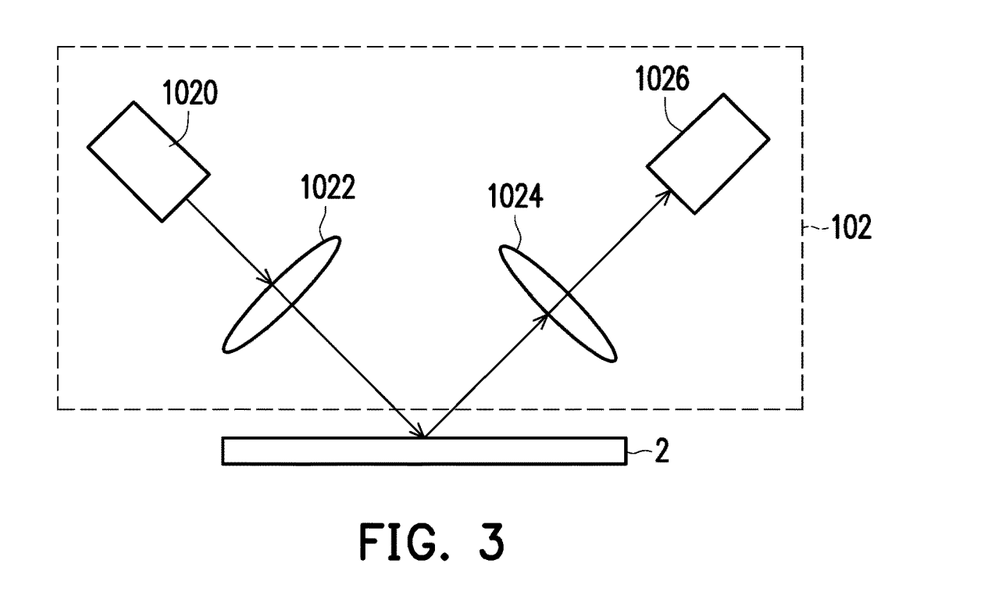
FIG. 3 is a schematic diagram of an automatic optical inspection module of the inspection module in FIG. 1A.
Figure 4:
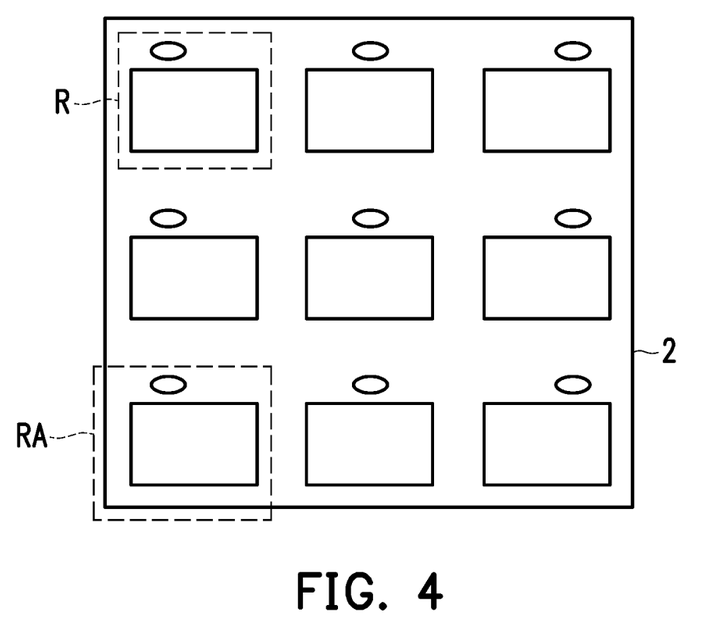
FIG. 4 is a schematic top view of a substrate.
Figure 5A:
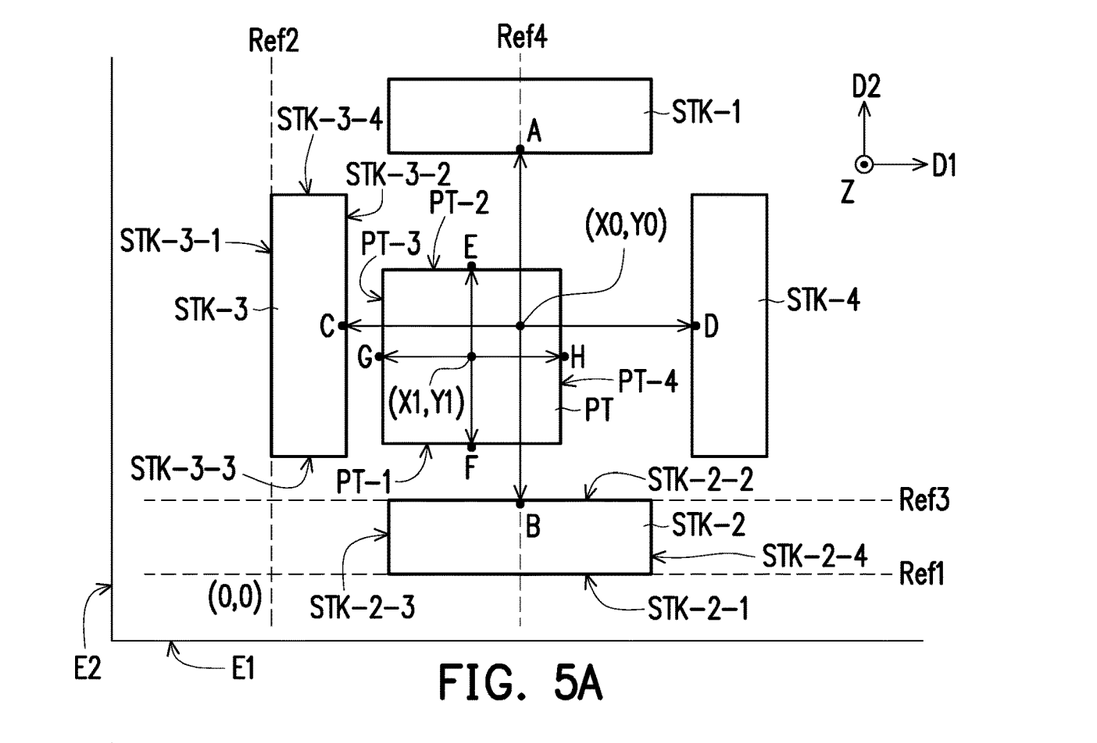
FIG. 5A and FIG. 5B are respectively enlarged schematic diagrams of an area RA in FIG. 4 before and after correction.
Figure 5B:
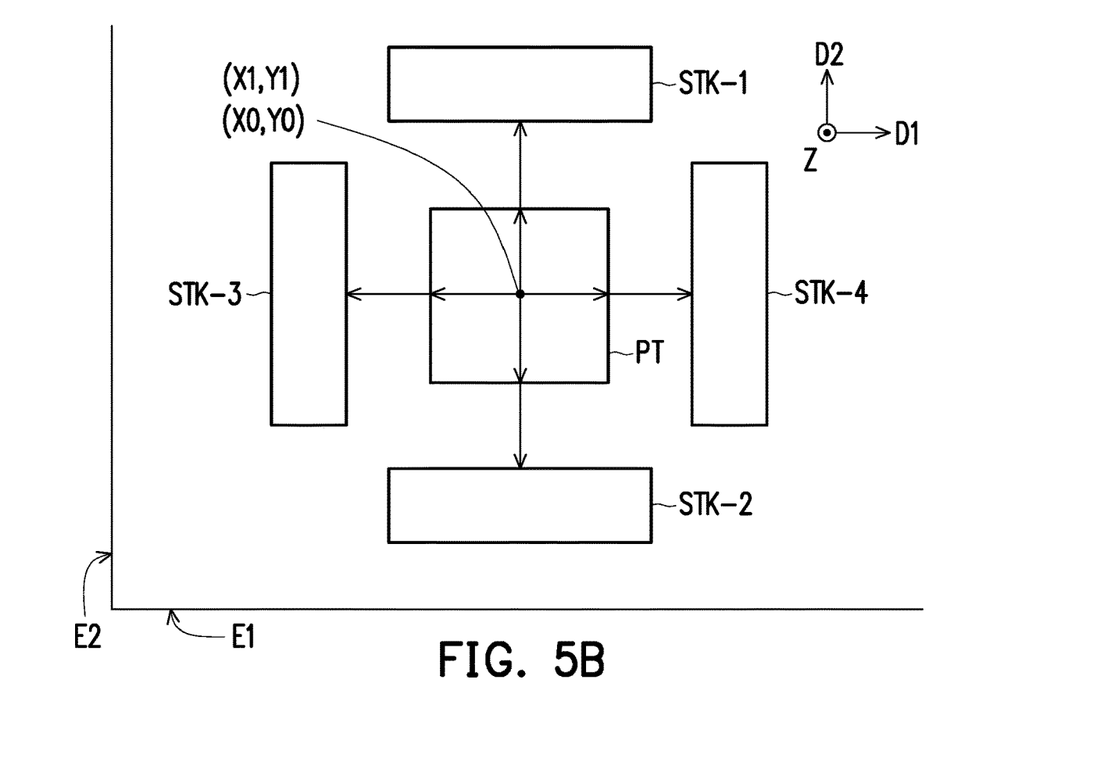
Figure 6:
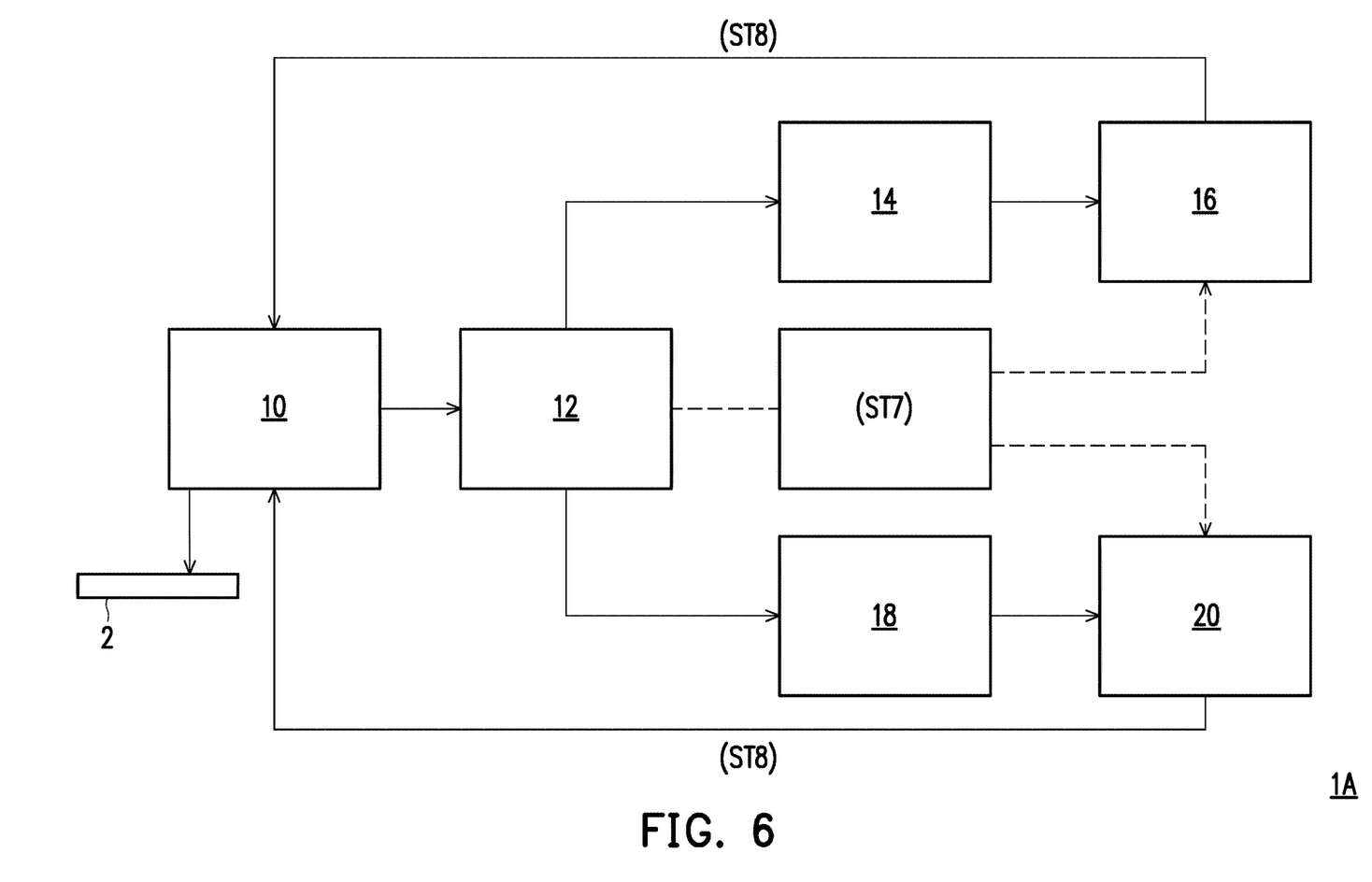
FIG. 6 is a schematic flowchart of a method for manufacturing an electronic device according to some other embodiments of the disclosure.
Figure 7:
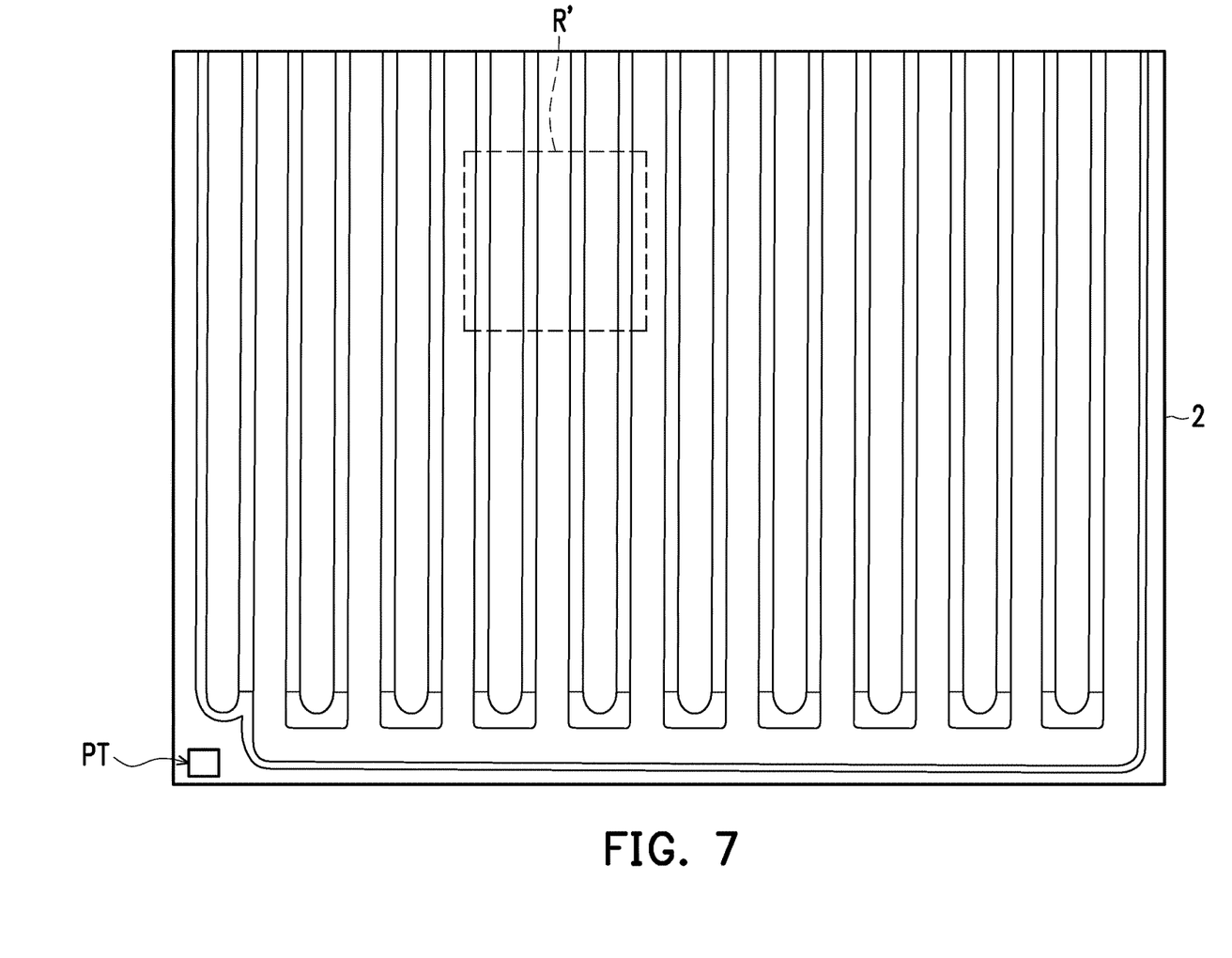
FIG. 7 is another schematic top view of a substrate.
Figure 8A:
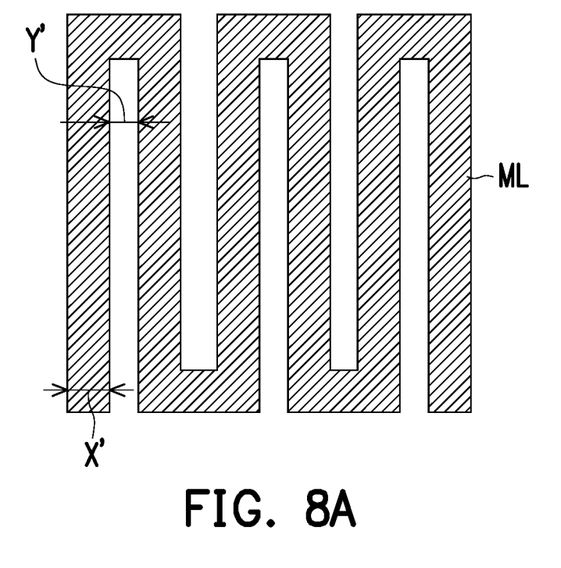
FIG. 8A and FIG. 8B are respectively enlarged schematic diagrams of an area R' in FIG. 7 before and after correction.
Figure 8B:
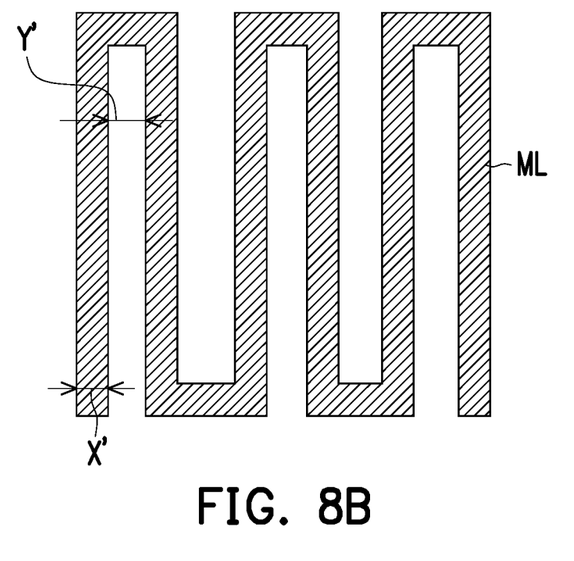
Figure 9:
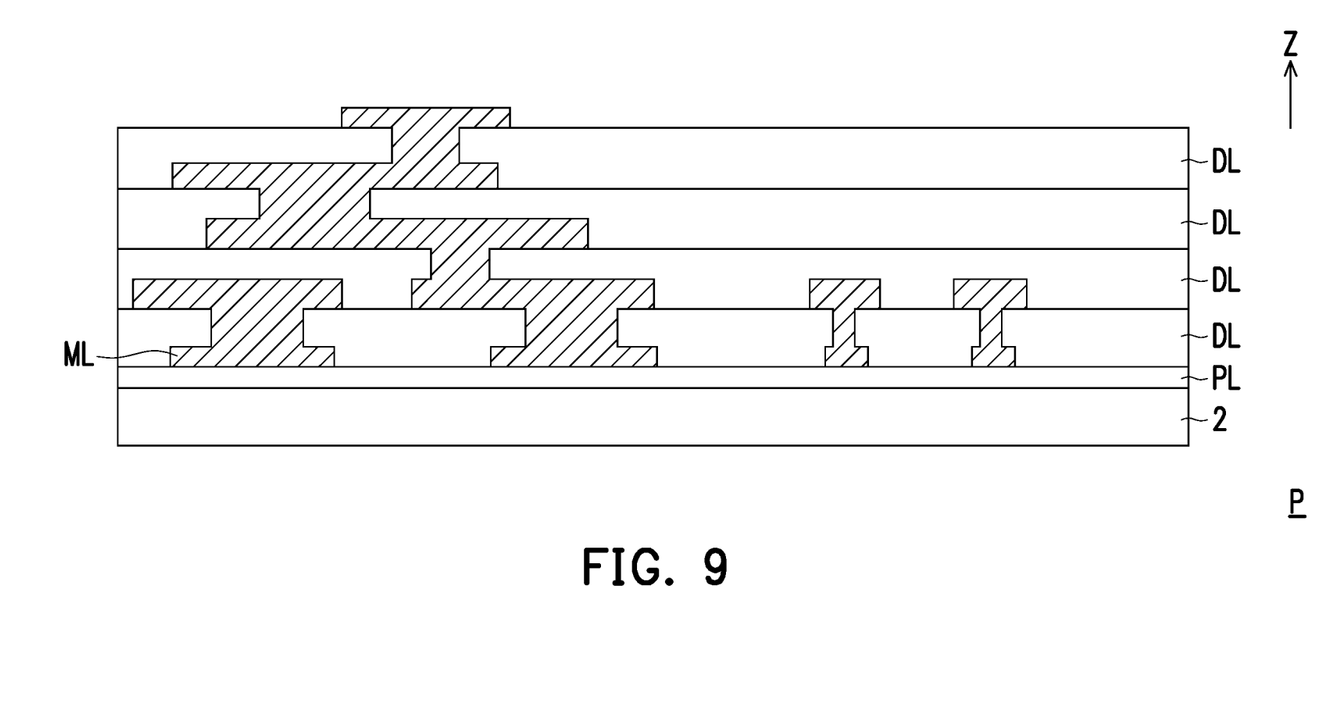
FIG. 9 is a schematic partial cross-sectional diagram of an electronic device according to some embodiments of the disclosure.

FIG. 1A and FIG. 1B are respectively schematic flowcharts of a method for manufacturing an electronic device according to some embodiments of the disclosure. FIG. 2 is a schematic diagram of a color confocal module of the inspection module in FIG. 1A. FIG. 3 is a schematic diagram of an automatic optical inspection module of the inspection module in FIG. 1A. FIG. 4 is a schematic top view of a substrate. FIG. 5A and FIG. 5B are respectively enlarged schematic diagrams of an area RA in FIG. 4 before and after correction. FIG. 6 is a schematic flowchart of a method for manufacturing an electronic device according to some other embodiments of the disclosure. FIG. 7 is another schematic top view of a substrate. FIG. 8A and FIG. 8B are respectively enlarged schematic diagrams of an area R' in FIG. 7 before and after correction. FIG. 9 is a schematic partial cross-sectional diagram of an electronic device according to some embodiments of the disclosure.

In the embodiments of FIG. 1A to FIG. 8B, the same or similar elements adopt the same or similar reference numerals, and redundant description is omitted. In addition, the features in different embodiments may be mixed and matched arbitrarily as long as they do not violate the spirit of the disclosure or conflict with each other, and simple equivalent changes and modifications made in accordance with the specification or claims still fall within the scope of the disclosure.

Please refer to FIG. 1A and FIG. 1B. The disclosure is a method 1 for manufacturing an electronic device. The method referred to in the disclosure may be used for alignment inspection, for example, and the steps of alignment inspection include, for example: providing a substrate, wherein the substrate has a test key (step ST1); providing a connecting member on the substrate, wherein the connecting member includes a first dielectric layer, a first metal circuit layer, and a test pattern, wherein the first metal circuit layer and the test pattern are disposed on the first dielectric layer and electrically insulated from each other (step ST2); detecting a first area of the electronic device (such as the test key on the substrate, but not limited thereto) to obtain a first information, and detecting a second area of the electronic device (such as the test pattern of the connecting member on the substrate, but not limited thereto) to obtain a second information (step ST3); transmitting the first information and the second information to a processing system (step ST4); comparing the first information and the second information to obtain a difference (step ST5); and determining whether to correct based on the difference, for example, determining whether the difference is greater than or equal to −2 and less than or equal to 2 (step ST6). If the difference is greater than or equal to −2 and less than or equal to 2, then the first process machine is started to produce; and if not, then the correction information is transmitted to the first process machine via a first interface system.

In some embodiments, as shown in FIG. 9, an electronic device P may be a connecting member formed on a substrate 2, and the connecting member may include a plurality of dielectric layers DL and a plurality of metal circuit layers ML, but the disclosure is not limited thereto. The electronic device may include a connection pad, a chip, a capacitor, a combination of the above or other external elements, but the disclosure is not limited thereto. The chip or the capacitor may be electrically connected to each other via the connecting member. For example, the electronic device may be, for example, a packaged element, the connecting member may be, for example, a redistribution layer (RDL) of the packaged element, and the redistribution layer is formed by one or a plurality of metal circuit layers ML and one or a plurality of dielectric layers DL. The metal circuit layers ML and the dielectric layers DL of the disclosure may be directly formed on the substrate 2, or there are other layers (such as a release layer PL) between the metal circuit layers ML and the substrate 2 or between the dielectric layers DL and the substrate 2, but the disclosure is not limited thereto. Specifically, the metal circuit layers ML and the dielectric layers DL, for example, may be stacked in sequence along a vertical projection direction Z. For example, the metal circuit layers ML and the dielectric layers DL may be stacked on the substrate 2 in sequence along the vertical projection direction Z, wherein the material of the metal circuit layers ML may include, for example, copper (Cu), aluminum (Al), titanium (Ti), other suitable metals, or a combination of the above, and the dielectric layers DL may include, for example, an organic material layer, an inorganic material layer, or a combination of the above, wherein the organic material layer may include, for example, polyimide (PI) or other suitable organic dielectric materials, and the inorganic material layer may include, for example, silicon nitride ($SiN_x$), silicon oxide ($SiO_x$), aluminum oxide ($Al_2O_3$), silicon oxynitride ($SiO_xN_y$), or other suitable materials, but the disclose is not limited thereto. The substrate 2 may include, for example, a rigid substrate or a flexible substrate, and the material of the substrate 21 may include, for example, glass, polyimide (PI), polyethylene terephthalate (PET), plastic, epoxy, resin, ceramic, silicon or other suitable materials, but the disclosure is not limited thereto. According to some embodiments of the disclosure, the electronic device P may include an integrated circuit (IC) substrate, but the disclosure is not limited thereto.

In some embodiments, an inspection module 10 may include a color confocal module 100 (please refer to FIG. 2) and an automatic optical inspection module 102 (please refer to FIG. 3), wherein the automatic optical inspection module may be, for example, automated optical inspection (AOI), but the disclosure is not limited thereto. Please refer to FIG. 2, the color confocal module 100 may be used to measure the warpage amount of the substrate 2, but the disclosure is not limited thereto. In some embodiments, the color confocal module 100 may include a white light source 1000 (for example, providing light with a wavelength of 360 nm to 700 nm), a lens 1002, and a spectrometer 1004, but the disclosure is not limited thereto. In some embodiments, the white light source 1000, the lens 1002, and the spectrometer 1004 may be connected to an optical fiber beam splitter 1008 via an optical fiber (such as an optical fiber 1006-1, an optical fiber 1006-2, and an optical fiber 1006-3), respectively. For example, the light (white light) from the white light source 1000 may be transmitted to the substrate 2 via the optical fiber 1006-1, the optical fiber beam splitter 1008, the optical fiber 1006-2, and the lens 1002 in sequence, and the light reflected by the substrate 2 may be transmitted to the spectrometer 1004 via the lens 1002, the optical fiber 1006-2, the optical fiber beam splitter 1008, and the optical fiber 1006-3 in sequence.

The lens 1002 may include a beam splitter (not shown). The beam splitter may divide the white light into three wavebands, such as a long waveband (such as red waveband with a wavelength of 620 nm±20 nm), a medium waveband (such as green waveband with a wavelength of 550 nm±20 nm), and a short waveband (such as blue waveband with a wavelength of 450 nm±20 nm). Without changing the height of the lens 1002 and the substrate 2, the distance variation between the lens 1002 and a surface S of the substrate 2 may be calculated from the wavelength variation of the maximum light intensity measured by the spectrometer 1004 (that is, the height fluctuations of the surface S may be obtained), and accordingly, the warpage amount of the substrate 2 is obtained.

Compared with the manual method of measuring the warpage amount of the substrate using a thickness gauge, measuring the warpage amount of the substrate via the color confocal module 100 may save manpower or improve performance. Or, whether the substrate 2 may be smoothly absorbed by the process machine in the subsequent process may be determined via the warpage amount of the substrate 2. Or, for example, the correction value may be calculated with an AI algorithm and fed back to the subsequent process, thereby improving production efficiency or product yield, but the disclosure is not limited thereto. The following illustrates with a packaged element.

Referring to FIG. 3, the automatic optical inspection module 102 may be used, for example, to inspect the metal circuit layers ML on the substrate 2 (refer to FIG. 9). For example, the automatic optical inspection module 102 may be used to inspect whether a parameter such as size, location, or spacing of the conductive wires in the metal circuit layers ML is consistent with the preset value, or to inspect whether the conductive wires are disconnected, etc., but the disclosure is not limited thereto. In some embodiments, the automatic optical inspection module 102 may include a fluorescent light source 1020, a filter 1022, a polarizing filter 1024, and a sensor 1026, but the disclosure is not limited thereto. The filter 1022 may be used to filter light from 400 nm to 600 nm, for example. In some embodiments, the filter 1022 may also be used to filter light at 400 nm or less to reduce the damage of light to the dielectric layers DL (refer to FIG. 9, such as the PI layer) on the substrate 2, but the disclosure is not limited thereto. The polarizing filter 1024 may filter light from 400 nm to 600 nm, and may also filter light reflected by non-metal layers (the dielectric layers DL as shown in FIG. 9) and the bottom layer to reduce the interference of light on the top-layer image, thereby improving image quality, reducing misjudgment, or alleviating the situation of computing overload. Moreover, via the characteristics that the dielectric layers DL reflect fluorescence and the metal circuit layers ML absorb fluorescence, the dielectric layers DL and the metal circuit layers ML on the substrate may respectively present black and white images on the sensor 1026. By analyzing the size, shape, or location, etc., of the black image, whether the size, location, or spacing, etc., of the conductive wires is consistent with the preset value may be determined or a defect may be inspected.

In some embodiments, although not shown, the substrate 2 forming the connecting member may be disposed on a mobile carrier, wherein the mobile carrier may include an X-movement axis and a Y-movement axis, so that the substrate 2 may be moved relative to the color confocal module 100 or the automatic optical inspection module 102. In some embodiments, the mobile carrier may have a positioning accuracy of less than 10 μm to facilitate defect inspection, but the disclosure is not limited thereto.

The first information and the second information may include location information, size information (such as line width), or distance information (such as line spacing) of the connecting member or pattern on the substrate 2. FIG. 4 to FIG. 5B are illustrated by taking the first information and the second information as location information as examples.

Step ST1 may include providing the substrate 2 disposed on a first process machine 16. Please refer to FIG. 4, the substrate 2 may include a plurality of test keys R, for example. The substrate 2 may include a substrate edge E1 extended along a first direction D1, and the substrate 2 may also include a substrate edge E2 extended along a second direction D2. FIG. 4 schematically shows that the substrate 2 includes nine test keys arranged in an array, but the number or distribution of the test keys is not limited thereto. The test keys are used for alignment, for example. FIG. 5A is an enlarged view of the area RA in FIG. 4. In some embodiments, as shown in FIG. 5A, the test keys may include a sub test key STK-1, a sub test key STK-2, a sub test key STK-3, and a sub test key STK-4, wherein the sub-test key STK-1 and the sub-test key STK-2 are extended in the first direction D1 and arranged in the second direction D2, and the sub-test key STK-3 and the sub-test key STK-4 are extended in the second direction D2 and arranged in the first direction D1, wherein the first direction D1 is perpendicular to the second direction D2, and the first direction D1 and the second direction D2 are respectively perpendicular to the vertical projection direction Z. The number of the sub-test key may be 2, 3, or more than 3, but the disclosure is not limited thereto. The shape of the sub-test keys may be rectangular, square, diamond, circular, or other suitable shapes, but the disclosure is not limited thereto.

For example, the sub-test key STK-2 is located adjacent to the substrate edge E1 and the substrate edge E2, the sub-test key STK-2 includes a first side STK-2-1 and a second side STK-2-2 opposite to the first side STK-2-1, the first side STK-2-1 and the second side STK-2-2 are extended along the first direction D1, and the first side STK-2-1 is closer to the substrate edge E1 than the second side STK-2-2. The sub-test key STK-2 includes a third side STK-2-3 and a fourth side STK-2-4 opposite to the third side STK-2-3, the third side STK-2-3 and the fourth side STK-2-4 are extended along the second direction D2, and the third side STK-2-3 is closer to the substrate edge E2 than the fourth side STK-2-4.

Moreover, the sub-test key STK-3 is located adjacent to the substrate edge E1 and the substrate edge E2, the sub-test key STK-3 includes a first side STK-3-1 and a second side STK-3-2 opposite to the first side STK-3-1, the first side STK-3-1 and the second side STK-3-2 are extended along the second direction D2, and the first side STK-3-1 is closer to the substrate edge E2 than the second side STK-3-2. The sub-test key STK-3 includes a third side STK-3-3 and a fourth side STK-3-4 opposite to the third side STK-3-3, the third side STK-3-3 and the fourth side STK-3-4 are extended along the first direction D1, and the third side STK-3-3 is closer to the substrate edge E1 than the fourth side STK-3-4.

The origin coordinates (0,0) indicated in FIG. 5A may be, for example, to provide a reference line Ref 1 passing through the first side STK-2-1 of the sub-test key STK-2 and extended along the first direction D1, and provide a reference line Ref 2 passing through the first side STK-3-1 of the sub-test key STK-3 and extended along the second direction D2, wherein the intersection point of the reference line Ref 1 and the reference line Ref 2 is the origin coordinates (0,0).

Point B indicated in FIG. 5A may be, for example, an intermediate point between the third side STK-2-3 and the fourth side STK-2-4. A reference line Ref 3 passing through point B and extended along the first direction D1 is provided, and a reference line Ref 4 passing through point B and extended along the second direction D2 is provided, wherein the intersection point of the reference line Ref 3 and the reference line Ref 4 is the coordinates (XB,YB) of point B. In the same way, the coordinates of point A, point C, and point D may be obtained, which are not repeated herein. Since the sub-test key STK-1 and the sub-test key STK-2 are arranged along the second direction D2, the coordinates of point A are (XA,YA), wherein XA and XB are the same. Since the sub-test key STK-3 and the sub-test key STK-4 are arranged along the first direction D1, the coordinates of point C are (XC,YC), and the coordinates of point D are (XD.YD), wherein YC and YD are the same.

Step ST2 may include providing a connecting member on the substrate, that is, a dielectric layer DL is disposed on the substrate 2, and a metal circuit layer ML and a test pattern PT are disposed on the dielectric layer DL. In other words, a metal layer is patterned to form the metal circuit layer ML and the test pattern PT, and the metal circuit layer ML and the test pattern PT are electrically insulated from each other, wherein the test pattern PT and the test keys are disposed correspondingly. The number of the test pattern PT may be 1, 2, or more than 2, but the disclosure is not limited thereto. The shape of the test pattern PT may be rectangular, square, diamond, circular, or other suitable shapes, but the disclosure is not limited thereto. For example, when the test pattern PT is a square, the test pattern PT may include a first side PT-1 and a second side PT-2 extended along the first direction D1 and arranged in the second direction D2, wherein the first side PT-1 is closer to the second side STK-2-2 of the sub-test key STK-2 than the second side PT-2. The test pattern PT further includes a third side PT-3 and a fourth side PT-4 extended along the second direction D2 and arranged in the first direction D1, wherein the third side PT-3 is closer to the second side STK-3-2 of the sub-test key STK-3 than the fourth side PT-4. In particular, the coordinates (X1,Y1) of the test pattern PT may be derived from a plurality of points on the test pattern PT, for example. For example, on the test pattern PT, point E is the midpoint of the second side PT-2, point F is the midpoint of the first side PT-1, point G is the midpoint of the third side PT-3, and point H is the midpoint of the fourth side PT-4, and the coordinates thereof are respectively (XE,YE), (XF,YF), (XG,YG), and (XH,YH), and X1=(XG+XH)/2, Y1=(YE+YF)/2.

Step ST3 may include inspecting the test keys and the test pattern respectively to obtain the first information and the second information. The first information includes, for example, the coordinates (X0,Y0) of the test keys, and the second information includes, for example, the coordinates (X1,Y1) of the test pattern PT. The coordinates (X0, Y0) of the test key may be deduced from the locations of a plurality of sub-test keys. For example, the coordinates of point A on the sub-test key STK-1 are (XA, YA), the coordinates of point B on the sub-test key STK-2 are (XB,YB), the coordinates of point C on the sub-test key STK-3 are (XC.YC), and the coordinates of point D on the sub-test key STK-4 are (XD,YD), and X0=(XC+XD)/2, Y0=(YA+YB)/2.

Please continue to refer to FIG. 1A and FIG. 5A. Step ST4 may include transmitting the first information and the second information to a processing system. A processing system 12 is coupled to the inspection module 10, and the inspection module 10 may transmit the measured first information and second information to the processing system 12, wherein the processing system 12 may compare the first information and the second information to obtain the difference (step ST5), and determine whether to correct based on the difference, for example, determine whether the difference is greater than or equal to −2 and less than or equal to 2 (step ST6). If the difference is greater than or equal to −2 and less than or equal to 2, then the first process machine 16 is activated to continue production, and if not, then the correction information is transmitted to the first process machine 16 via a first interface system. For example, in FIG. 5A, when X1 is not equal to X0 or Y1 is not equal to Y0, the alignment is incorrect. In detail, the connecting member is formed by alternately stacking the dielectric layers DL and the metal circuit layers ML. When the processing system 12 indicates that X1 is not equal to X0 or Y1 is not equal to Y0, the alignment of the test pattern PT is inaccurate. Furthermore, it may indicate that the alignment of the metal circuit layers ML is inaccurate, and the correction information includes the maximum correction value (X0-X1, Y0-Y1).

If it is determined that correction is needed, the processing system 12 may transmit the correction information to a first interface system 14 coupled to the processing system 12 to transmit the correction information to the first process machine 16 coupled to the first interface system 14 via the first interface system 14. In some embodiments, when the difference between X0 and X1 falls within the range of ±10 μm to ±15 μm of X0 (e.g., X0−15 μm≤|X0−X1|≤X0+15 μm) and the difference between Y0 and Y1 falls within the range of ±10 μm to ±15 μm of Y0 (e.g., Y0−15 μm≤|Y0−Y1|≤Y0+15 μm), the difference is still within the specification range, and therefore correction does not have to be performed. In some embodiments, the misalignment issue may be alleviated via one-time revision/correction. Specifically, when the processing system 12 indicates |X0−X1|=20 μm, the metal circuit layers ML are offset in the first direction D1. Therefore, the information may be transmitted to the first process machine 16 via the first interface system 14, and the revision/correction of the location of a machine equipment may be performed (such as adjusting a mobile carrier, a robot arm, or any suitable element of the exposure machine) and the misalignment issue of the metal circuit layers ML may be alleviated, so that the test pattern PT approaches the test keys R. In some embodiments, the misalignment issue may be alleviated via progressive correction. For example, when the processing system 12 indicates |X0−X1|=20 μm, the metal circuit layer ML is offset in the first direction D1. Therefore, the information may be transmitted to the first process machine 16 via the first interface system 14. At this time, the location of the first process machine 16 may be adjusted by 4 μm at a time, and correction may be performed 5 times to improve the alignment relationship between different metal circuit layers ML, thereby improving the quality or reliability of the electronic device, but the disclosure is not limited thereto.

The coupling may include transmitting information via a method such as a network or an optical fiber, but the disclosure is not limited thereto. The processing system 12 may be used to process/calculate the information from the inspection module 10 and perform correction determination and correction value calculation. For example, the processing system 12 may establish a predictive model using big data established by a plurality of measured values via linear regression analysis or a compensation value algorithm (such as an AI algorithm), and bring the first information and the second information from the inspection module 10 into the prediction model to obtain the correction information (such as the correction amount, the number of corrections, the maximum correction value, etc.) In some embodiments, the processing system 12 may include a microcontroller, a central processing unit (CPU), or a graphics processing unit (GPU), but the disclosure is not limited thereto.

In some embodiments, the method 1 for manufacturing an electronic device may further include evaluating confidence level based on the correction information. When the confidence level is greater than or equal to the threshold (for example, the confidence level is greater than or equal to 95%), the correction information is transmitted to the first process machine 16 via the first interface system 14, and when the confidence level is less than the threshold, manual correction is performed (step ST7). The confidence level is calculated by, for example, a compensation value algorithm or a predictive model, and is used to evaluate the abnormality of the correction, so as to reduce the occurrence of excessive compensation value or the compensation value exceeding the safety specification. When the confidence level is less than the threshold, the operator may be warned by issuing a warning signal. For example, when the electronic device is manufactured, the difference $|X0-X1|\leq 30$ μm or the difference $|Y0-Y1|\leq 30$ μm may be set as the upper limit of the specification. When the processing system 12 indicates $|X0-X1|\leq 30$ μm*0.95=28 μm or $|Y0-Y1|\leq 30$ μm*threshold=28 μm, the correction information evaluates the confidence level to be greater than or equal to 95%. If the processing system 12 indicates 30 μm*0.95<$|X0-X1|\leq 30$ μm or 30 μm*0.95<$|Y0-Y1|\leq 30$ μm, then the processing system 12 may determine that the correction information is close to the upper limit of the specification. That is, the confidence level of the correction information is less than 95%, and a personnel review mechanism may be activated by issuing a warning signal. For example, the operator may refer to the calculation result of the processing system 12 to determine whether the correction information is correct, and manually input the correction information into the first process machine 16 for compensation. Or the operator finds that the calculation result of the processing system 12 determines that the correction information is abnormal, and may further track the cause of the abnormality, which may be abnormal inspection equipment, abnormal manufacture process, abnormal machine equipment parameters, etc., but not limited thereto. Via the steps of evaluating the confidence level, misjudgment of correction information may be avoided or abnormalities may be found early.

The first interface system 14 may include a computer and an input device. The input device may include, for example, a KVM system composed of a keyboard, a display, and a mouse. Since the first interface system 14 is coupled between the processing system 12 and the first process machine 16, via the above design, the information may be used or read by different process equipment in the process. For example, an electronic device manufacturing and production system with a higher degree of freedom across equipment brands or computer operating systems may be achieved, but the disclosure is not limited thereto.

The first process machine may include a machine for processing the substrate 2, such as an exposure machine or a coating machine, but the disclosure is not limited thereto. In some embodiments, the first process machine 16 is an exposure machine, and the processing system 12 may transmit the warpage amount information of the substrate 2 to the first process machine 16 via the first interface system 14, so that the exposure machine may dynamically adjust the Z-axis height of the focusing system based on this area to achieve maximum exposure accuracy.

As shown in FIG. 5B, after the alignment correction, the difference between the coordinates (X1,Y1) of the test pattern PT and the coordinates (X0,Y0) of the test keys may be reduced.

In some embodiments, as shown in FIG. 1A, after the first process machine 16 performs compensation according to the correction information, the method 1 for manufacturing an electronic device may further include inspecting the compensated substrate 2 via the inspection module 10 (step ST8) to confirm the validity of the compensation value. For example, if the compensation value makes the alignment difference value fall within the acceptable range or the alignment difference falls within the specification, then the subsequent manufacturing process may be continued; and if the alignment difference value falls outside the acceptable range, correction may be performed again (continue to step ST3). In some embodiments, the number of corrections may be set according to process requirements or product accuracy requirements.

In some embodiments, the method for manufacturing an electronic device with packaged elements may also be adjusted for line width, line spacing, or film thickness to achieve the expected target specifications. As shown in FIG. 6, a method 1A for manufacturing an electronic device with packaged elements may further include transmitting the correction information to a second process machine 20 via a second interface system 18. For example, the first interface system 14 may be coupled between the processing system 12 and the first process machine 16 via a network or optical fiber, and the second interface system 18 may be coupled between the processing system 12 and the second process machine 20.

The first process machine 16 and the second process machine 20 may be, for example, a coating machine and an exposure machine, respectively. After the processing system calculates the correction value, the correction value is respectively transmitted to the first process machine 16 and the second process machine 20 via the first interface system 14 and the second interface system 18 to adjust the coating thickness (rotation speed, time, ejection volume) and adjust the exposure time.

In some embodiments, as shown in FIG. 7, a test area (such as 2 cm*2 cm, but not limited thereto) may be taken from the substrate 2 arbitrarily. FIG. 7 is a schematic diagram of grayscale sampling of the substrate 2, for example. The oblique line regions in FIG. 8A and FIG. 8B are the metal circuit layers ML. The area where the conductive wires in the metal circuit layers ML is located is inspected. In other words, the first area is the area where the conductive wires in the metal circuit layers ML are located, and the first information obtained by inspecting the conductive wires of the metal circuit layers ML in the first area includes, for example, a target line width information X. Moreover, the blank area between adjacent conductive wires in the metal circuit layers ML is inspected. In other words, the second area is a blank area between adjacent conductive wires in the metal circuit layers ML, and the first second information obtained by inspecting the blank area between adjacent conductive wires in the metal circuit layers ML in the second area includes, for example, a target line spacing information Y. Correspondingly, by inspecting the area where a plurality of conductive wires in the metal circuit layers ML are located, the second first information obtained may include an average line width information X', and by inspecting a plurality of blank areas between a plurality of conductive wires in the metal circuit layers ML, the second information obtained may include an average line spacing information Y'. For example, 9 points may be taken from the test area to measure the average line width information X' and the average line spacing information Y'. When $|(X-Y)| \leq 2$ and/or $|(X'-Y')| \leq 2$, it is determined that no correction is needed, and the process machine may continue to produce, and when $|(X-Y)| > 2$ or $|(X'-Y')| > 2$, it is determined that correction is needed.

In a case that the difference between the average line width information X' and the average line spacing information Y' is $|(X'-Y')| > 2$, the line width and the line spacing are not equal, as shown in FIG. 8A. Then, the processing system 12 transmits the correction information to the first process machine 16 via the first interface system 14, for example, a coating machine, an exposure machine, or other process machines. For example, the coating machine may instantly adjust the coating thickness (rotation speed, time, or ejection volume) or the exposure machine may instantly adjust the exposure time, or the coating machine may gradually adjust the coating thickness (rotation speed, time, or ejection volume) or the exposure machine may gradually adjust the exposure time. In other words, when the average line width X' is greater than the average line spacing Y', the coating machine should reduce the ejection volume. For example, adjustment may be made 0.5 g at a time to make the average line width X' close to the average spacing Y'. The gradual reduction may avoid too much reduction at a time, and on the contrary, the average line width X' is less than the average line spacing Y', which may affect the reliability of the electronic device. The adjusted average line width information X' approaches the average line spacing information Y', as shown in FIG. 8B.

Please continue to refer to FIG. 7. In some embodiments, a test area (such as 2 cm*2 cm, but not limited thereto) may be taken from the substrate 2 arbitrarily. By inspecting the area where a plurality of conductive wires in the metal circuit layers ML are located, the first information obtained includes, for example, the target line width information X, and the second information includes, for example, the average line width information X'. By inspecting a plurality of blank areas between a plurality of conductive wires in the metal circuit layers ML, the first information obtained includes, for example, the target line spacing information Y, and the second information includes, for example, the average line spacing information Y'. For example, 9 points may be taken from the test area to measure the average line width information X' and the average line spacing information Y'. When $|(X-X')| \leq 2$ and $|(Y-Y')| \leq 2$, it is determined that no correction is needed, and when $|(X-X')| > 2$ or $|(Y-Y')| > 2$, it is determined that correction is needed.

Based on the above, in an embodiment of the disclosure, in the process of manufacturing the electronic device, whether correction and correction information are to be performed is determined according to the first information and the second information, and via the first interface system, the correction information is transmitted to the first process machine to adjust production parameters in real time, thereby improving production efficiency and product reliability. For example, the deviation caused by substrate warpage may be corrected by the method for manufacturing the electronic device referred to in the disclosure. And by coupling the interface system between the processing system and the process machine, an electronic device manufacturing and production system with a higher degree of freedom across equipment brands or computer operating systems may be achieved. In some embodiments, for example, the warpage amount of the substrate may be measured by the color confocal module to save manpower or improve performance, and whether the substrate may be smoothly absorbed by the process machine in the subsequent process may be determined via the warpage amount of the substrate. In some embodiments, the automatic optical inspection module may be used to determine whether the size, location, or spacing and the like of the conductive wires are consistent with preset values or to inspect defects. In some embodiments, a polarizing filter may be disposed in the automatic optical inspection module to reduce the interference of reflected light on the top image, thereby improving image quality, reducing misjudgment, or alleviating computing overload.

The above embodiments are used to describe the technical solution of the disclosure instead of limiting it. For example, the above embodiments are used for manufacturing electronic devices, especially for fan-out panel-level package electronic devices. The fan-out panel-level package technique may include redistribution layer first (RDL first) process and chip first process. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

Although the embodiments of the disclosure and their advantages are disclosed as above, it should be understood that any person skilled in the art, without departing from the spirit and scope of the disclosure, may make changes, substitutions, and modifications, and features between the embodiments may be mixed and replaced at will to form other new embodiments. In addition, the scope of the disclosure is not limited to the manufacturing process, machinery, manufacturing, material composition, device, method, and steps in the specific embodiments described in the specification. Any person skilled in the art may understand the current or future development processes, machinery, manufacturing, material composition, device, method, and steps from the content of the disclosure, which may all be adopted according to the disclosure as long as they may implement substantially the same function or obtain substantially the same result in an embodiment described here. Therefore, the scope of the disclosure includes the above manufacturing processes, machines, manufactures, material compositions, devices, methods, and steps. In addition, each claim constitutes an individual embodiment, and the scope of the disclosure also includes the combination of each claim and embodiment. The scope of the disclosure shall be subject to the scope defined by the following claims.

What is claimed is:
1. A method for manufacturing an electronic device, comprising:
providing an inspection module to inspect a first area of the electronic device to obtain a first information and inspect a second area of the electronic device to obtain a second information;

transmitting the first information and the second information to a processing system;

comparing the first information and the second information to obtain a difference; and transmitting a correction information to a first process machine via a first interface system, wherein when the difference is greater than or equal to −2 and less than or equal to 2, the first process machine is started to produce, wherein the inspection module comprises a color confocal module and an automatic optical inspection module.

2. The method for manufacturing the electronic device of claim 1, further comprising:

transmitting the correction information to a second process machine via a second interface system.

3. The method for manufacturing the electronic device of claim 1, further comprising:

a substrate having a test key; and a connecting member disposed on the substrate, wherein the connecting member has a test pattern, and the test pattern corresponds to the test key.

4. The method for manufacturing the electronic device of claim 1, further comprising:

evaluating a confidence level according to the correction information, wherein when the confidence level is greater than or equal to a threshold, the correction information is transmitted to the first process machine via the first interface system, and when the confidence level is less than the threshold, a manual correction is performed.

5. The method for manufacturing the electronic device of claim 1, wherein the correction is a progressive correction.

6. The method for manufacturing the electronic device of claim 1, wherein the automatic optical inspection module comprises a polarizing filter.

7. The method for manufacturing the electronic device of claim 1, wherein the color confocal module comprises a beam splitter.

8. The method for manufacturing the electronic device of claim 1, wherein the first information comprises coordinates (X0, Y0) of a test key, the second information comprises coordinates (X1,Y1) of a test pattern, and the correction information comprises a maximum correction value (X0−X1, Y0−Y1).

9. The method for manufacturing the electronic device of claim 1, wherein the first information comprises a target line width information X and a target line spacing information Y, the second information comprises an average line width information X' and an average line spacing information Y', and when $|(X-X')|\leq 2$ and $|(Y-Y')|\leq 2$, it is determined that no correction is needed, and when $|(X-X')|>2$ or $|(Y-Y')|>2$, it is determined that correction is needed.

10. The method for manufacturing the electronic device of claim 1, wherein the first information comprises a target line width information X and an average line width information X', the second information comprises a target line spacing information Y and an average line spacing information Y', and when $|(X-Y)|\leq 2$ and $|(X'-Y')|\leq 2$, it is determined that no correction is needed, and when $|(X-Y)|>2$ or $|(X'-Y')|>2$, it is determined that a correction is needed.

11. A method for manufacturing an electronic device, comprising:

providing a substrate, wherein the substrate has a test key;

providing a connecting member on the substrate, wherein the connecting member comprises a dielectric layer, a metal circuit layer, and a test pattern, and the metal circuit layer and the test pattern are disposed on the dielectric layer and electrically insulated from each other;

inspecting the test key on the substrate to obtain a first information, and inspecting the test pattern of the connecting member to obtain a second information;

transmitting the first information and the second information to a processing system;

comparing the first information and the second information to obtain a difference; and determining whether to perform a correction based on the difference.

12. The method for manufacturing the electronic device of claim 11, wherein the step of determining whether to perform the correction comprises:

determining whether the difference is greater than or equal to −2 and less than or equal to 2, wherein in a case that the difference is greater than or equal to −2 and less than or equal to 2, a first process machine is started to produce, and in a case that the difference is less than −2 or greater than 2, the correction information is transmitted to the first process machine via a first interface system.

13. The method for manufacturing the electronic device of claim 12, further comprising:

transmitting the correction information to a second process machine via a second interface system.

14. The method for manufacturing the electronic device of claim 12, further comprising:

evaluating a confidence level according to the correction information, wherein when the confidence level is greater than or equal to a threshold, the correction information is transmitted to the first process machine via the first interface system, and when the confidence level is less than the threshold, a manual correction is performed.

15. The method for manufacturing the electronic device of claim 11, wherein the correction is a progressive correction.

16. The method for manufacturing the electronic device of claim 11, wherein the inspection comprises measuring a warpage amount of the substrate via a color confocal module.

17. The method for manufacturing the electronic device of claim 16, wherein the color confocal module comprises a beam splitter.

18. The method for manufacturing the electronic device of claim 11, wherein the inspection comprises inspecting a size, a location, or a spacing of a conductive wire in the metal circuit layer on the substrate via an automatic optical inspection module.

* * * * *